Jan. 26, 1960 D. S. HUMPHREYS 2,922,846
AUDIO AMPLIFIER SYSTEM
Filed April 18, 1957
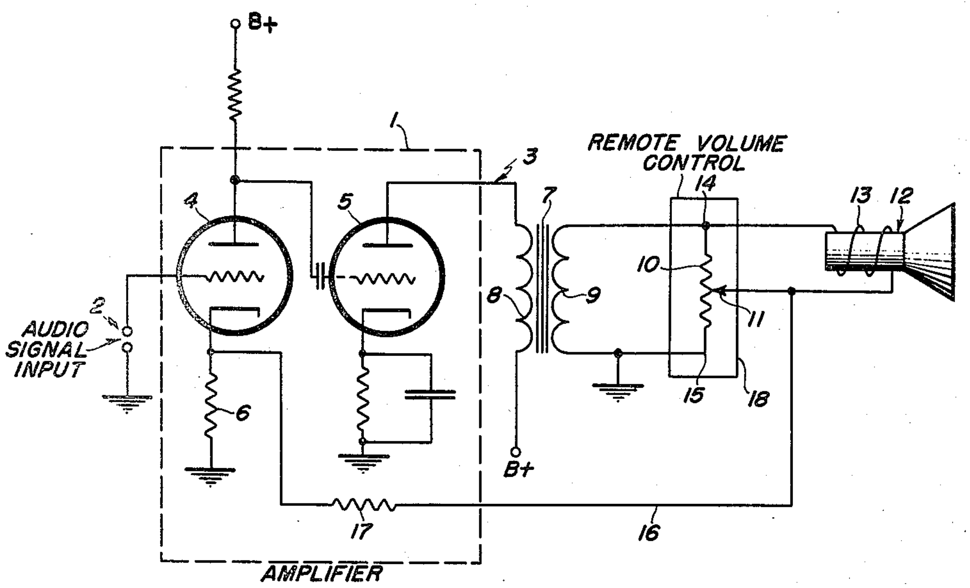
INVENTOR.
DWIGHT S. HUMPHREYS
BY George A. Gust
ATTORNEY 2,922,846
Patented Jan. 26, 1960

2,922,846

AUDIO AMPLIFIER SYSTEM

Dwight S. Humphreys, Fort Wayne, Ind., assignor to International Telephone & Telegraph Corporation Application April 18, 1957, Serial No. 653,625
4 Claims. (Cl. 179—1)

The present invention relates to an audio amplifier system and more particularly to an audio amplifier having a remotely located volume control which is adjustable to achieve optimum fidelity for any given level of volume.

In certain instances, it is desirable to control the audio amplifier, and especially a high fidelity amplifier, from a position remote to both the amplifier and speaker system. In the usual instance, it is impractical to dispose the volume control at a remote distance from the amplifier for the reason that the volume control is included in a high impedance circuit of the amplifier whereby the capacity of the leads extending between the amplifier and the volume control becomes an appreciable factor and deleteriously affects the circuit parameters to such an extent as to interfere with the fidelity of reproduction.

An object of the present invention is to provide an amplifier circuit with a remote volume control which is adjustable to achieve optimum fidelity for any given level of volume or loudness.

It is another object to provide a low impedance volume control for an amplifier circuit which renders any capacity in the connecting leads to the volume control of negligible consequence whereby the fidelity of reproduction will not be deleteriously affected.

It is a further object of the invention to provide a volume control in an amplifier system which upon adjustment varies the inverse feedback to the amplifier in a direction which compensates for changes in amplifier output impedance, thereby maintaining the operating characteristics of the amplifier within its minimum distortion operating range.

The above-mentioned and other features and objects of this invention and the manner of attaining them will become more apparent and the invention itself will be best understood by reference to the following description of an embodiment of the invention taken in conjunction with the accompanying drawing, wherein the drawing is a schematic diagram illustrating one embodiment of this invention.

Referring to the drawing, a conventional amplifier 1 is provided with input and output circuits 2 and 3 respectively. The amplifier 1 may consist of any suitable network configuration, the one illustrated comprising two triode amplifiers 4 and 5 suitably coupled together. The triode 4 is provided with a cathode resistor 6 to which is coupled a feedback circuit described hereafter. To the anode of the triode 5 is coupled an output transformer 7 having primary and secondary windings 8 and 9, respectively. Across the secondary winding 9 is connected a volume control or conventional potentiometer 10 having a variable tap 11. A conventional speaker 12 having a voice coil 13 is coupled between the tap 11 and the upper end 14 of the potentiometer 10. The lower end 15 of the potentiometer is grounded as shown. Between the tap 11 and cathode of the triode 4 is connected an inverse feedback loop 16 having a suitable resistor 17 in series therewith.

In one operating embodiment of this invention, that portion of the volume control contained within the block 18 is remotely located with respect to the remaining portions of the circuitry, there being three wires or leads required between this volume control and the amplifier. These leads may be shielded or not, as desired.

In operation, an audio signal from any suitable source is coupled to the amplifier input circuit 2. The signal is amplified by the tubes 4 and 5 and fed to the output transformer 7 in the usual manner. The tap 11 on the volume control is adjusted either upwardly or downwardly for effecting a change in the loudness output of the speaker 12. Movement of the tap 11 upwardly toward the terminal 14 serves to reduce the loudness, whereas movement downwardly serves to increase the loudness, maximum volume being obtained when the tap 11 coincides with the lower end 15 of the volume control.

Inverse feedback from the tap 11 to the tube 4 is provided by means of the line 16, which feedback increases as the tap 11 is moved upwardly and decreases as it is moved downwardly, thus it will be noted that movement of the tap 11 upwardly serves to decrease loudness but to increase the feedback. Opposite or downward movement of the tap 11 produces the converse result, or in other words, maximum loudness with minimum feedback.

The circuit parameters are so selected that when the tap 11 is moved away from the end 15, the impedance presented to the anode circuit of the tube 5 increases. Therefore, in order that the tube 5 will not be driven into its distortion-producing operating range, the grid drive to the tube must be adequately reduced. This reduction is accomplished by using the voltage appearing between the tap 11 and end 15 as inverse feedback voltage which, in the present instance, is applied to the cathode of the tube 4. The values of the potentiometer 10, cathode resistor 6, feedback resistor 17, and the output voltage must be so selected and adjusted that the grid drive to the tube 5 will not exceed the determining value of the tube 5 plate impedance above which signal distortion will occur.

In explaining the foregoing operation, the output impedance presented to the output tube 5 may be represented by the equation $$R_L=R_SN^2$$

where $R_L$ is the load impedance presented to the output tube. $R_S$ is the impedance across the secondary winding 9 of the transformer for any volume control setting. "N" is primary to secondary turns ratio of the output transformer.

Since $R_S$ is a variable, $R_L$ is also a variable. Therefore, the product of the tube 5 plate current and $R_L$ as the volume or loudness is reduced must be either a constant or decrease in magnitude, otherwise it would not be possible to prevent the output tube 5 from being driven into the area of plate saturation. In other words, $i_pR_L$ equal a constant or reduces in magnitude as the volume is reduced, $i_p$ being the instantaneous plate current.

While it will appear obvious to a person skilled in the art that the circuit parameters may be selected as design preferences may dictate in order to achieve the above desired characteristics, one operating embodiment of the invention uses fifty (50) ohms resistance for the potentiometer 10 and six (6) to eight (8) ohms resistance for the voice coil 13. Other values may obviously be used without departing from the scope of this invention.

While I have described above the principles of my invention in connection with specific apparatus, it is to be clearly understood that this description is made only by way of example and not as a limitation to the scope of my invention.

What is claimed is:

1. An audio amplifier system comprising a signal amplifier having input and output circuits, said output circuit including a transformer having primary and secondary windings, one end of the secondary winding being grounded, a potentiometer coupled across said secondary winding and having a variable tap movable between the potentiometer ends, a speaker operatively coupled between the ungrounded end of said secondary winding and said tap, and an inverse feedback loop coupled between said tap and said input circuit.

2. An audio amplifier system comprising an output tube having a control grid and anode, an output transformer having primary and secondary windings, one end of the secondary winding being grounded, the primary winding being coupled in series with said anode, a potentiometer having opposite ends coupled across said secondary winding, a variable tap on said potentiometer, a speaker voice coil coupled between said tap and the ungrounded side of said secondary winding, and an inverse feedback loop operatively coupled between said tap and said control grid for varying the feedback inversely with the change in impedance presented to said anode as said tap is varied.

3. An audio amplifier system comprising a signal amplifier having an output tube, said tube having a control grid and an anode, an output transformer having primary and secondary windings, one end of the secondary winding being grounded, the primary winding being connected in series with said anode, a resistor connected in parallel with said secondary winding, a movable tap on said resistor, a speaker voice coil connected in parallel with said tap and the ungrounded end of said secondary winding, and an inverse feedback line directly connected to said tap and operatively coupled to said control grid for varying the feedback inversely with the change in impedance presented to said anode as said tap is varied.

4. The system of claim 3 wherein said resistor is located remotely with respect to said amplifier.

References Cited in the file of this patent

UNITED STATES PATENTS

| | | |
|---|---|---|
| 2,210,001 | Perkins | Aug. 6, 1940 |
| 2,255,679 | Riddle | Sept. 9, 1941 |
| 2,647,173 | Beurtheret | Aug. 28, 1953 |
| 2,728,874 | Morgan | Dec. 27, 1955 |
| 2,752,432 | Richter | June 26, 1956 |